(12) United States Patent
Yoo et al.

(10) Patent No.: US 9,640,304 B2
(45) Date of Patent: May 2, 2017

(54) CERAMIC LAMINATE SHEET WITH FLEXIBILITY AND PREPARATION METHOD THEREOF

(71) Applicant: SKC CO., LTD, Suwon-si, Gyeonggii-do (KR)

(72) Inventors: Il Hwan Yoo, Seongnam-si (KR); Jin Cheol Kim, Hwaseong-si (KR); Tae Kyoung Kim, Seoul (KR); Dong Gyu Lee, Suwon-si (KR); Yu Jin Lee, Osan-si (KR)

(73) Assignee: SKC CO., LTD., Suwon-si (KR)

( * ) Notice: Subject to any disclaimer, the term of this patent is extended or adjusted under 35 U.S.C. 154(b) by 528 days.

(21) Appl. No.: 13/939,905

(22) Filed: Jul. 11, 2013

(65) Prior Publication Data

US 2014/0017486 A1   Jan. 16, 2014

(30) Foreign Application Priority Data

Jul. 12, 2012 (KR) .......................... 10-2012-0076136
May 16, 2013 (KR) .......................... 10-2013-0055944

(51) Int. Cl.
*B32B 38/04* (2006.01)
*B32B 3/18* (2006.01)
(Continued)

(52) U.S. Cl.
CPC .......... *H01B 17/60* (2013.01); *B29C 67/0011* (2013.01); *B32B 3/266* (2013.01);
(Continued)

(58) Field of Classification Search
CPC ....... C04B 37/00; C04B 37/008; B32B 37/00; B32B 37/182; B32B 37/185;
(Continued)

(56) References Cited

U.S. PATENT DOCUMENTS

2009/0117328 A1* 5/2009 Kawai ..................... B32B 18/00
                                                           428/141
2012/0045257 A1* 2/2012 Mizoguchi .......... G03G 15/162
                                                           399/302
(Continued)

FOREIGN PATENT DOCUMENTS

EP          2058119 A2     5/2009
JP      2008124197 A  *   5/2008
(Continued)

OTHER PUBLICATIONS

Machine translation: JP2008124197 (A); inventor: Matsuzaki, Toru; applicant: Kitagawa; international classification: B32B9/00.*
(Continued)

*Primary Examiner* — Linda L Gray
(74) *Attorney, Agent, or Firm* — Sughrue Mion, PLLC

(57) ABSTRACT

Disclosed is a ceramic laminate sheet comprising a ceramic sheet having a plurality of cracks and a polymer resin layer disposed on one side or both sides of the ceramic sheet, wherein the plurality of cracks pass through the ceramic sheet from one side to the other side thereof, the cracks divide the ceramic sheet into a plurality of pieces, grooves for formation of the cracks are not provided in one side and the other side of the ceramic sheet.

2 Claims, 3 Drawing Sheets

(51) Int. Cl.
B32B 9/04 (2006.01)
B32B 27/14 (2006.01)
H01B 17/60 (2006.01)
B29C 67/00 (2017.01)
B32B 9/00 (2006.01)
B32B 18/00 (2006.01)
B32B 38/00 (2006.01)
C04B 35/26 (2006.01)
C04B 37/00 (2006.01)
H05K 9/00 (2006.01)
H01F 1/375 (2006.01)
B32B 7/12 (2006.01)
B32B 27/30 (2006.01)
B32B 27/32 (2006.01)
B32B 27/36 (2006.01)
B32B 3/26 (2006.01)
H01Q 1/38 (2006.01)
H01Q 7/06 (2006.01)

(52) U.S. Cl.
CPC .............. *B32B 7/12* (2013.01); *B32B 9/005* (2013.01); *B32B 9/045* (2013.01); *B32B 18/00* (2013.01); *B32B 27/304* (2013.01); *B32B 27/32* (2013.01); *B32B 27/36* (2013.01); *B32B 27/365* (2013.01); *B32B 38/0004* (2013.01); *C04B 35/265* (2013.01); *C04B 37/008* (2013.01); *H01F 1/375* (2013.01); *H05K 9/0075* (2013.01); *B32B 2038/0024* (2013.01); *B32B 2307/558* (2013.01); *B32B 2315/02* (2013.01); *B32B 2457/00* (2013.01); *C04B 2235/6025* (2013.01); *C04B 2235/6562* (2013.01); *C04B 2235/668* (2013.01); *C04B 2237/34* (2013.01); *C04B 2237/62* (2013.01); *C04B 2237/704* (2013.01); *C04B 2237/708* (2013.01); *H01Q 1/38* (2013.01); *H01Q 7/06* (2013.01); *Y10T 156/1052* (2015.01); *Y10T 428/252* (2015.01)

(58) Field of Classification Search
CPC . B32B 37/203; B32B 37/206; B32B 38/0004; B32B 38/1808; B32B 2038/0024; B32B 2250/03; B32B 3/00; B32B 3/18; B32B 3/266; B32B 9/005; B32B 9/045; B32B 27/14; Y10T 156/1052
See application file for complete search history.

(56) References Cited

U.S. PATENT DOCUMENTS

2012/0062435 A1 3/2012 Kato et al.
2012/0088070 A1 4/2012 Nishi

FOREIGN PATENT DOCUMENTS

JP 2008-296431 A 12/2008
JP 201045121 A 2/2010
JP 2011-044549 A 3/2011
JP 2011211337 A 10/2011

OTHER PUBLICATIONS

European Patent Office, Extended European Search Report dated Mar. 6, 2014, issued in corresponding European Application No. 13176054.8.
Japanese Patent Office Communication dated Mar. 24, 2015 issued in counterpart Japanese Application No. 2013147127.
European Patent Office, European Search Report dated Oct. 29, 2013, issued in counterpart European Patent Application No. 13176054.8.

* cited by examiner

CERAMIC LAMINATE SHEET WITH FLEXIBILITY AND PREPARATION METHOD THEREOF

FIELD OF THE INVENTION

The present invention relates to a ceramic laminate sheet and a preparation method thereof, which can be used in applications in which a flexible ceramic laminate sheet is required, such as near field communication (NFC), electromagnetic shielding, S-pens, and wireless chargers.

BACKGROUND OF THE INVENTION

From the past, ceramic materials have been used for electronic equipment to absorb electromagnetic waves emitted therefrom or those penetrated therein. Particularly, in near field communication (NFC), a ceramic sintered body such as ferrite has recently been used as a magnet sheet for securing communication distance and reliability by suppressing an eddy current generated from a metal/conductive plate adjacent to an antenna and jamming radio waves caused by the eddy current. However, the ceramic sintered body is too brittle, and thus, if the ceramic sintered body has a small thickness, it is easily broken even by low pressure applied thereto. Therefore, it is not easy to apply the ceramic sintered body to a curved or flexible device requiring flexibility. Furthermore, since the ceramic sintered body has low flexibility, a process of attaching the ceramic sintered body to an NFC antenna is not easy. To solve such limitations, a method of providing flexibility has been known in which a blade cutter or laser facility is used to form a groove with an appropriate depth in a ceramic green sheet prepared through a tape casting method, then the green sheet with the formed groove is sintered to obtain a ceramic sintered sheet, and thereafter an adhesive layer and a protective layer are formed on or attached to the ceramic sintered sheet.

Japanese Patent No. 4277596 discloses a sintered ferrite substrate comprising an adhesive layer on one surface thereof, wherein the sintered ferrite substrate can be easily attached to or detached from a curved or uneven surface of an electronic device without irregular damage by forming one or more continuous U- or V-shaped grooves in at least one surface to allow the substrate to be separated along the groove. In such a sintered ferrite substrate, U-/V-shaped grooves induce regular cracks when a bending force is applied to the substrate, thereby preventing irregular cracks and also having flexibility together with the adhesive layer and the protective layer formed on each side of the substrate. However, high-priced equipment is required to form grooves, leading to an increase in production cost. Moreover, since the ferrite sheets are becoming thinner and slimmer in line with trends for making electronic products more lightweight, thin, and micronized, it is not easy to control the depth of the groove, which causes processing and management costs to increase and defects to increased. In addition, the tact time for the groove forming process is long, which decreases productivity and reduces the cost competitiveness of products.

Also, a conventional process may enable a ceramic sheet to have flexibility, but has problems in that flexibility is not maximally obtained and the ceramic sheet has poor flexibility in a certain direction in which the flexibility is not imparted, when a user desires to bend the ceramic sheet in that direction. Particularly, in an operation of providing flexibility to a ceramic sheet and performing a subsequent process, or attaching the ceramic sheet to an NFC antenna, the ceramic sheet is necessarily subjected to bending or impacts. At this time, the ceramic material properties of conventional ceramic sheets are deteriorated.

SUMMARY OF THE INVENTION

Therefore, it is an object of the present invention to provide a ceramic laminate sheet which has excellent flexibility in any direction even without the formation of grooves and of which the material properties are not deteriorated even with a deforming force or impact applied thereto, and a method for effectively preparing the ceramic laminate sheet.

In accordance with the object, one embodiment of the present invention provides a ceramic laminate sheet comprising a ceramic sheet having a plurality of cracks and a polymer resin layer disposed on one side or both sides of the ceramic sheet, wherein the plurality of cracks pass through the ceramic sheet from one side to the other side thereof, the cracks divide the ceramic sheet into a plurality of pieces, grooves for formation of the cracks are not provided in one side and the other side of the ceramic sheet, and the number of the plurality of pieces is 100 or more per unit area ($cm^2$) of the ceramic sheet.

Further, another embodiment of the present invention provides a ceramic laminate sheet comprising a ceramic sheet having a plurality of cracks and a polymer resin layer disposed on one side or both sides of the ceramic sheet, wherein the plurality of cracks pass through the ceramic sheet from one side to the other side thereof, the cracks divide the ceramic sheet into a plurality of pieces, grooves for the formation of the cracks are not provided in one side and the other side of the ceramic sheet, and an average space between parallel cracks among the plurality of cracks is 800 μm or less.

Furthermore, in accordance with the other object, one embodiment of the present invention provides a method for preparing a ceramic laminate sheet comprising the steps of: (a) forming a polymer resin layer on one side or both sides of a sintered ceramic sheet to obtain a laminate sheet; and (b) dividing the ceramic sheet into a plurality of pieces by pressurizing the obtained laminate sheet to form a plurality of cracks in the ceramic sheet, wherein the number of the plurality of pieces formed is 100 or more per unit area ($cm^2$) of the ceramic sheet.

Since the ceramic laminate sheet of the present invention does not have a groove for crack formation, it is possible to significantly reduce the process time and cost and also have ceramic material properties equal to or more favorable than conventional ceramic sheets. Also, the ceramic laminate sheet of the present invention has excellent flexibility and exhibits material properties which are not deteriorated even when a deforming force or impact is applied during an attachment process or the like. Therefore, the ceramic laminate sheet of the present invention can be easily attached to curved or flexible devices as well as flat devices and also exhibits superior ceramic properties.

BRIEF DESCRIPTION OF THE DRAWINGS

The above and other objects and features of the present invention will become apparent from the following description of the invention, when taken in conjunction with the accompanying drawings, which respectively show.

<Drawing symbols>

| | | |
|---|---|---|
| 100: ceramic laminate sheet of the present invention | | |
| 110: ceramic sheet, | 111: crack, | 112: groove |
| 120: flexible film, | 130: adhesive layer or bonding layer | |
| 211 and 212: pressure roller, | 220: elastic roller, | 230: elastic support plate |

DETAILED DESCRIPTION OF THE INVENTION

Structure of Ceramic Laminate Sheet

Figure 1:
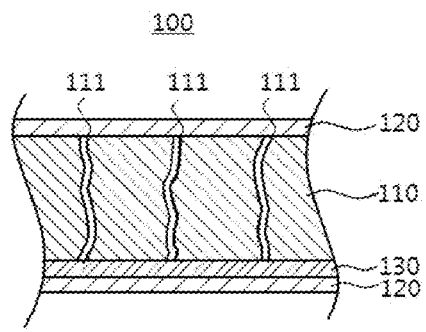
FIG. 1 illustrates an example of a cross-sectional view of a ceramic laminate sheet having flexibility, according to the present invention.

As illustrated in FIG. 1, a ceramic laminate sheet 100 according to an embodiment of the present invention comprises a ceramic sheet 110. Also, the ceramic laminate sheet 100 comprises a polymer resin layer disposed on one side or both sides of the ceramic sheet 110.

Ceramic Sheet

A plurality of cracks 111 is formed in the ceramic sheet 110 to divide the ceramic sheet 110 into a plurality of pieces.

In the present invention, a crack means a minute break having the shape of a line which is formed in the ceramic sheet, and each crack minutely divides the ceramic sheet while passing through the ceramic sheet from one side to the other side. The plurality of cracks divides the ceramic sheet into a plurality of ceramic sheet pieces.

Therefore, a crack is distinguished from a groove which is furrowed with a certain depth and width, a gap which is opened to have a certain space, or a hole which is an opening with a certain diameter and passing through something.

The crack in the present invention also includes cracks caused by a physical force as well as cracks caused by chemical factors, and also includes cracks that are artificially formed, as well as cracks inevitably formed during handling. Preferably, the crack formed in the ceramic sheet of the present invention means a crack which is artificially caused by a physical force.

In the present invention, groves for the formation of the cracks are not present in one side and the other side of the ceramic sheet 110.

Figure 2:
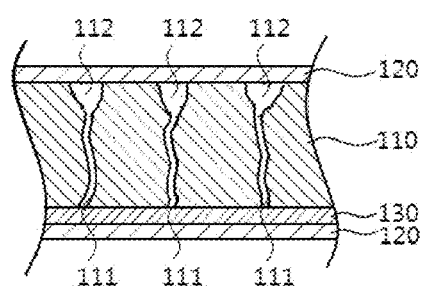
FIG. 2 illustrates an example of a cross-sectional view of a conventional ceramic laminate sheet having flexibility.

Conventionally, to divide the ceramic sheet into a plurality of pieces, cracks are formed by forming grooves in a green sheet before sintering, and then breaking the sheet by applying pressure thereto. Therefore, in the ceramic sheet prepared through the conventional method, as illustrated in FIG. 2, a portion of a groove 112 still remains on the surface of the ceramic sheet 110 in the vicinity of a crack 111. This groove 112 causes the thickness of the ceramic sheet to be decreased irregularly and properties of the ceramic sheet to be degraded. For example, in a ferrite sheet, permeability is lowered due to the presence of the groove. Furthermore, high-priced equipment is required to form the groove, and the process time is long, resulting in increased processing cost and time. Thus, these factors ultimately raise the price of a product.

In the ceramic sheet of the present invention, however, cracks are formed without the formation of a groove in a green sheet, and accordingly there is no groove remaining in the surface of the ceramic sheet. That is, the ceramic sheet 110 may be flat because there is no depression such as a groove in the surface of the ceramic sheet 110 in the vicinity of the crack 111. Accordingly, since the deterioration of ceramic material properties caused by a groove rarely occurs, and equipment and a process for the formation of the groove are not required, the price of a product can be significantly lowered.

In the ceramic laminate sheet of the present invention, the crack formed in the ceramic sheet may include regular and/or irregular cracks.

According to an example, the plurality of cracks formed in the ceramic sheet may be irregular cracks having completely non-uniform orientations and spaces.

According to another example, the plurality of cracks formed in the ceramic sheet may include cracks disposed in at least two directions crossing each other. Here, the cracks in the two directions may be (i) a crack in a first direction, and (ii) a crack in a second direction perpendicular to the first direction. The cracks in the first and second directions are merely formed to have their own orientations, but these cracks may be irregular cracks in terms of their overall shapes. Alternatively, the cracks in the two directions may be regular cracks such that line-shaped cracks having their own orientations are formed with a certain space therebetween.

According to another example, the plurality of cracks formed in the ceramic sheet may include cracks disposed in at least three directions crossing one another. Here, the cracks in the three directions may be (i) a crack in a first direction, (ii) a crack in a second direction perpendicular to the first direction, and (iii) a crack in a third direction diagonal to the first and second directions. The cracks in the three directions are merely formed to have their own orientations, but these cracks may be irregular cracks in terms of their overall shapes. Alternatively, the cracks in the three directions may be regular cracks such that line-shaped cracks having their own orientations are formed with a certain space therebetween.

Figure 3:
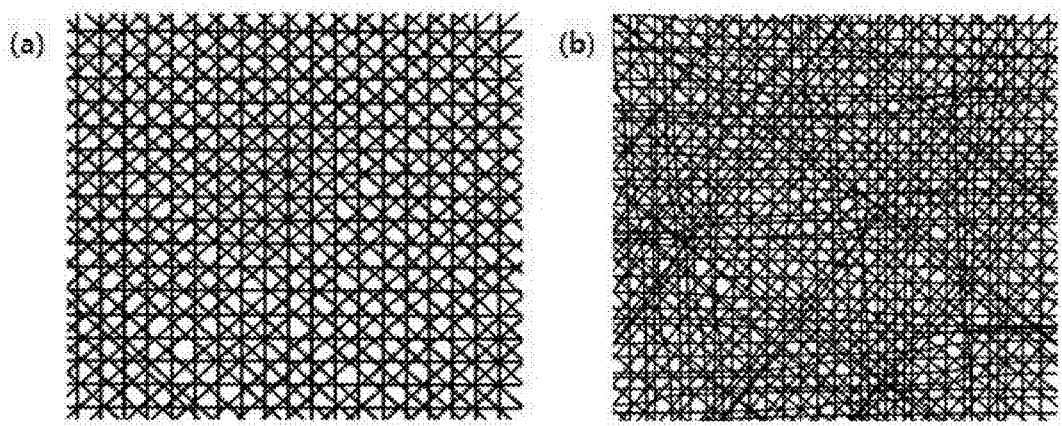
FIG. 3 illustrates various examples of crack patterns formed in a ceramic sheet.

According to still another example, the plurality of cracks formed in the ceramic sheet may include cracks disposed in at least four directions crossing one another. Here, the cracks in the four directions may be (i) a crack in a first direction, (ii) a crack in a second direction perpendicular to the first direction, (iii) a crack in a third direction diagonal to the first and second directions, and (iv) a crack in a fourth direction perpendicular to the third direction. The cracks in the four directions are merely formed to have their own orientations, but these cracks may be irregular cracks in terms of their overall shapes (see FIG. 3(b)). Alternatively, the cracks in the four directions may be regular cracks such that line-shaped cracks having their own orientations are formed with a certain space therebetween (see FIG. 3(a)).

According to yet another example, the plurality of cracks formed in the ceramic sheet may be a mixture of regular cracks which have uniform orientations and spaces and irregular cracks which have non-uniform orientations and spaces.

The ceramic sheet is divided into a plurality of pieces by the plurality of cracks, and the number of the plurality of pieces formed may be 100 or more per unit area ($cm^2$) of the ceramic sheet. Preferably, the number of the plurality of pieces formed may be in the range of from 100 to 1,200 per unit area ($cm^2$). More preferably, the number of the plurality of pieces formed may be in the range of from 350 to 950 per unit area ($cm^2$).

When the density of the ceramic pieces falls within the range above, it is possible to achieve more excellent flexibility and stable ceramic material properties. For example, when the density of ferrite pieces is less than the range above, there may be defects caused by a further decrease in permeability during a handling process such as an attachment process of the laminate sheet, or it may not be easy to perform the attachment process. On the contrary, a lower density of the ceramic pieces is more favorable in terms of permeability. For example, when the density of the ferrite pieces is 1,200 pieces/$cm^2$ or less, the permeability is more suitable for commercial production and is hardly decreased due to bending; however, when the density exceeds the above range, an excessive number of the pieces is unnecessarily present.

An average space between parallel cracks of the plurality of cracks may be 800 μm or less. Preferably, an average space between the parallel cracks may be in the range of 200 μm to 800 μm. More preferably, an average space between the parallel cracks may be in the range of 300 μm to 600 μm. Here, parallel cracks means that two cracks are substantially parallel to each other, and specifically refers to cracks which never encounter and have a difference in angle therebetween of 5° or less.

When an average space between the parallel cracks falls within the range above, it is possible to further satisfy more excellent flexibility and stable ceramic material properties. For example, if the space between the parallel cracks is greater than the preferable ranges, cracks are additionally generated due to bending (for instance, the removal of a release paper from a double-sided film, etc.) or impact, which necessarily occurs during a subsequent process or in practical use, thereby deteriorating ceramic material properties. On the contrary, if the space between the parallel cracks is less than the preferable ranges, the ceramic sheet may have higher flexibility than necessary, and may have poor ceramic material properties. Thus, in this case, there is the burden of having to use a ceramic sheet having more favorable inherent ceramic properties, for instance, higher permeability of a magnetic sheet. Also, if the space between the cracks is less than the preferable ranges, the manufacturing process may be complicated and the reliability may be deteriorated because the sizes of the crack pieces should be very small.

Materials for the ceramic sheet used in the present invention are not specifically limited, and thus all ceramic materials requiring flexibility are available. For example, the ceramic sheet may be a ceramic sintered sheet obtained by preparing a green sheet and then sintering the green sheet, or may be a ceramic sheet prepared through a thin film forming process or a thick film forming process. Non-limiting examples of the ceramic sheet may include a ceramic sheet having a magnetic property, e.g., a ferrite sheet.

The ceramic sheet may have a thickness ranging from 0.01 to 5 mm, preferably 0.01 to 0.3 mm, and more preferably 0.03 to 0.2 mm.

Polymer Resin Layer

A polymer resin layer is formed on one side or both sides of the ceramic sheet 110 of the present invention, and, for example, a flexible film 120, an adhesive layer or bonding layer 130, or a combination thereof may be laminated on the ceramic sheet 110.

Materials with flexibility may be unlimitedly used for the flexible film 120, and, for examples, polyethylene terephthalate (PET), polyethylene (PE), polyvinylchloride (PVC), polycarbonate (PC), polypropylene (PP), or a mixture thereof may be used for the flexible film 120.

Also, materials having an adhesive or bonding force may be unlimitedly used for the adhesive layer or bonding layer 130, and, for examples, a pressure sensitive adhesive (PSA), silicone-based PSA, or the like may be used for the adhesive layer or bonding layer 130.

According to an example, the adhesive layer or bonding layer 130 may be provided on one side or both sides of the flexible film 120 to improve adhesiveness, and thus the flexible film 120 can be attached to the ceramic sheet 110 through the adhesive layer or bonding layer 130. According to another example, the flexible film 120 may be a resin layer directly coated on the ceramic sheet 110.

The ceramic sheet 110 may be used such that the flexible film 120 attached thereto during or before a crack forming process is still left remaining, or is removed for final use.

The flexible film 120 and the adhesive layer or bonding layer 130 play roles in protecting the ceramic sheet and providing adhesiveness.

The flexible film 120 and the adhesive layer or bonding layer 130 may have a thickness ranging from 0.002 to 0.5 mm, and preferably 0.005 to 0.05 mm.

Properties and Uses of Ceramic Laminate Sheet

The ceramic laminate sheet as described above has excellent flexibility in any direction, and also exhibits ceramic material properties equal to or higher than ceramic sheets. Particularly, in an operation of allowing the ceramic sheet to have flexibility and performing a subsequent process, or attaching the ceramic sheet to an NFC antenna, a wireless charger, and the like, the ceramic sheet has to be bent or impacted during which the ceramic material properties of the conventional ceramic sheet according to the present invention are not deteriorated, in contrast to the conventional ceramic sheets.

Therefore, the ceramic laminate sheet of the present invention can be used in the preparation of a magnet sheet for securing communication distance and reliability by suppressing an eddy current generated from a metal/conductive plate adjacent to an antenna and jamming radio waves caused by the eddy current in near field communication (NFC), the preparation of a magnetic sheet for electromagnetic wave shielding, S-pens, wireless chargers, and the like. In particular, the ceramic laminate sheet of the present invention can be usefully used since the ceramic laminate sheet has excellent flexibility in an intended direction without the formation of additional cracks in the case of being applied to curved or flexible devices requiring flexibility.

Method for Preparing Ceramic Laminate Sheet

Hereinafter, a method for preparing a ceramic laminate sheet will be described in detail.

The ceramic laminate sheet of the present invention may be prepared by a method comprising the steps of: (a)

forming a polymer resin layer on one side or both sides of a sintered ceramic sheet; and (b) pressurizing an obtained laminate sheet to form a plurality of cracks in the ceramic sheet.

(a) Polymer Resin Layer Forming Step

The ceramic sheet used in step (a), which is a ceramic sheet which has been subjected to sintering, may be prepared through a typical ceramic sintering process. For example, the ceramic sheet may be prepared by mixing ceramic powders and a binder component; dispersing the resultant mixture; casting by means of a tape casting process and the like to form a green sheet; and sintering the green sheet at a high temperature.

The step of forming the polymer resin layer in step (a) may also be performed using a method of laminating a flexible film already formed, or a method of coating the ceramic sheet with a raw material resin for a film and then drying it.

Also, to secure an adhesive property, an adhesive layer or bonding layer, for example, acryl-based PSA, silicone-based PSA, etc. is formed on one side or both sides of the flexible film, and thereafter a laminating process may be performed.

(b) Crack Forming Step

Figure 4:
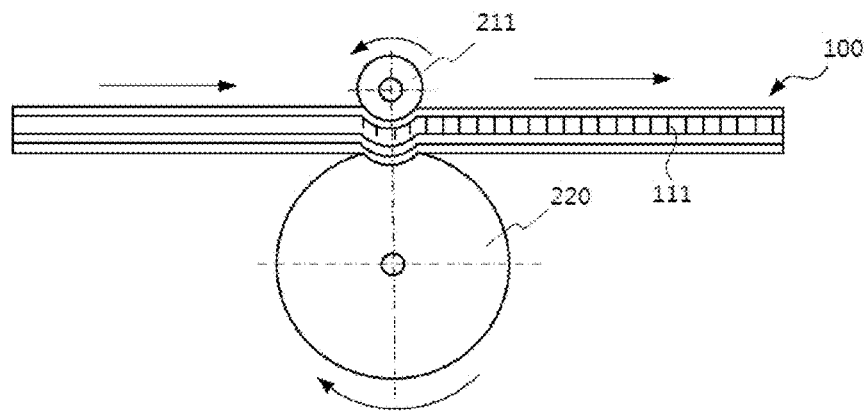
FIG. 4 illustrates an example of a method of forming cracks in a ceramic sheet, and specifically, a method of forming cracks in a ceramic sheet using a pressure roller and an elastic roller.
Figure 5:
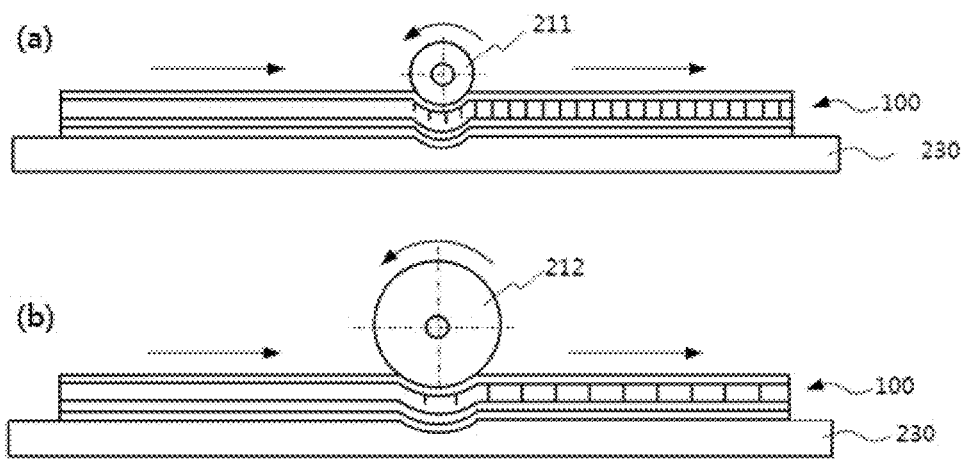
FIG. 5 illustrates another example of a method of forming cracks in a ceramic sheet, and specifically, a method of forming cracks in a ceramic sheet using a pressure roller and an elastic support plate. Also, changes in a space between cracks depending on a diameter of a pressure roller may be compared through FIGS. 5(a) and 5(b)

In step (b), the pressurizing may be performed by allowing the laminate sheet to pass under a pressure roller (see FIGS. 4 and 5). That is, the pressure roller is placed over the laminate sheet, and a plurality of cracks may be formed by allowing the laminate sheet to pass under the roller while being pressurized by the roller. The laminate sheet may be pressurized in such a way that the laminate sheet moves while the pressure roller is rotating in place, or the roller moves while the laminate sheet is at a standstill.

A processing speed (the moving speed of the laminate sheet or the moving speed of the pressure roller) may be 0.05 to 15 m/min, and preferably 0.5 to 7 m/min.

In step (b), a space between the cracks formed in the ceramic sheet or the number of divided ceramic pieces per unit area may be adjusted by changing the diameter of the pressure roller or changing the pressure during the pressurizing step and the moving speed of the pressure roller.

The pressure roller may have a diameter ranging from 5 to 1,000 mm, preferably 10 to 500 mm, and more preferably 10 to 50 mm. If the diameter of the pressure roller is less than the range above, the diameter is too small, thereby making it difficult to secure reliability of the pressure roller. If the diameter of the pressure roller exceeds the range above, additional cracks may be generated due to insufficient flexibility when the ceramic sheet is used.

Materials for the pressure roller may include all polymer materials, inorganic materials or metallic materials.

In step (b), the pressurizing may be performed by applying a flexion deformation force. "Flexion deformation force" refers to a force applied to deform an object to be bent, and may be variously adjusted depending on process conditions.

In particular, if an elastic material is placed under the laminate sheet, a portion pressurized by the roller is temporarily pressed due to the elasticity of an elastic body to be bent and deformed, and thus forming cracks in the ceramic sheet. Herein, the hardness of the elastic material may be in the range of from 0.1 to 100 degrees, and preferably 30 to 90 degrees. The elastic material may include all polymer materials having a certain elasticity including rubber, metallic materials, and the like.

The flexion deformation force applied to the laminate sheet may be variously adjusted by, for example, changing the load of the overlying pressure roller or the diameter of the overlying pressure roller, or changing the space between the overlying pressure roller and the elastic material. The load of the overlying pressure roller may be adjusted depending on the thickness of the laminate sheet, and may be, for example, 0.01 to 1 MPa. The space between the pressure roller and the elastic material may also be variously adjusted, and may be, for example, −10 to 0 mm.

According to an example, the pressurizing may be performed by allowing the laminate sheet to pass between the pressure roller and the elastic roller. Referring to FIG. 4, a pressure roller 211 is placed over a laminate sheet 100, and an elastic roller 220 is placed under the laminate sheet 100. Afterwards, the laminate sheet 100 may be pressurized while passing between the pressure roller 211 and the elastic roller 220. Here, the laminate sheet may be pressurized in such a way that the laminate sheet passes between the pressure roller and the elastic roller while the pressure roller and the elastic roller are rotating in place, or the pressure roller and the elastic roller move while the laminate sheet is at a standstill. The elastic roller 220 may have a diameter ranging from 5 to 1,000 mm, or 10 to 500 mm.

According to another example, the pressurizing may be performed by allowing the laminate sheet thereof to pass between the pressure roller and an elastic support plate. Referring to FIG. 5(a), the pressure roller 211 is placed over the laminate sheet 100, and an elastic support plate 230 is placed under the laminate sheet 100. Afterwards, the laminate sheet 100 may be pressurized while passing between the pressure roller 211 and the elastic support plate 230. Here, the laminate sheet may be pressurized in such a way that the laminate sheet passes between the pressure roller and the elastic support plate while the pressure roller is rotating in place and the elastic support plate is at a standstill, or the pressure roller moves while the laminate sheet is at a standstill. The elastic support plate 230 may have a thickness ranging from 1 to 1,000 mm, or 10 to 100 mm.

Also, as illustrated in FIG. 5, a space between the cracks may be adjusted by changing the diameter of the pressure roller. For example, the case where cracks are formed by means of a small-diameter pressure roller 211 as illustrated in FIG. 5(a) has smaller spaces between the cracks and has a greater density of ceramic pieces than the case where cracks are formed by means of a large-diameter pressure roller 212 as illustrated in FIG. 5(b).

In the method of the present invention, step (a) of forming the polymer resin layer and step (b) of forming the cracks may be performed separately or simultaneously.

According to an example, step (a) of forming the polymer resin layer and step (b) of forming the cracks may be performed separately. That is, step (a) of forming the polymer resin layer may be performed first and step (b) of forming the cracks may then be performed on the laminate sheet thus obtained. In the ceramic laminate sheet which has been subjected to step (b), a plurality of cracks may be formed in a processing direction X.

According to another example, step (a) of forming the polymer resin layer and step (b) of forming the cracks may be performed simultaneously through a roll lamination process. That is, lamination and crack formation may be performed at the same time by allowing the ceramic sheet to pass under the pressure roller in a state where the polymer resin layer is in contact with the ceramic sheet. Thus, the pressure required for lamination and the pressure required for a flexion deformation force may be supplied at the same time. In the ceramic laminate sheet which has been subjected to the roll lamination, a plurality of cracks may be formed in a processing direction X.

Figure 6:
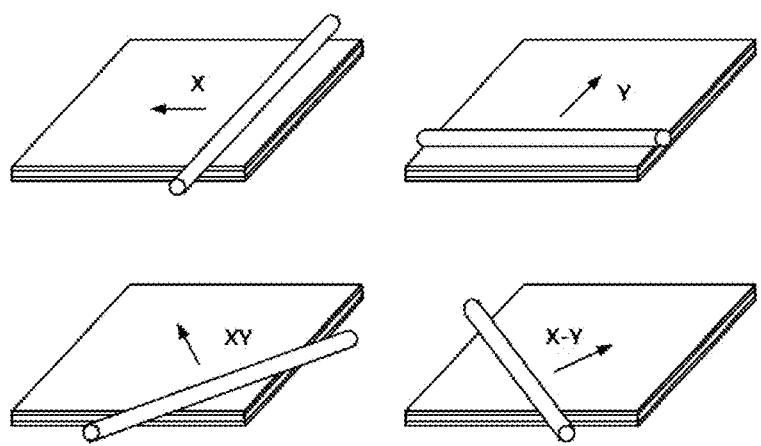
FIG. 6 illustrates four processing directions in a process of forming cracks in a ceramic sheet using a pressure roller.
Figure 7:
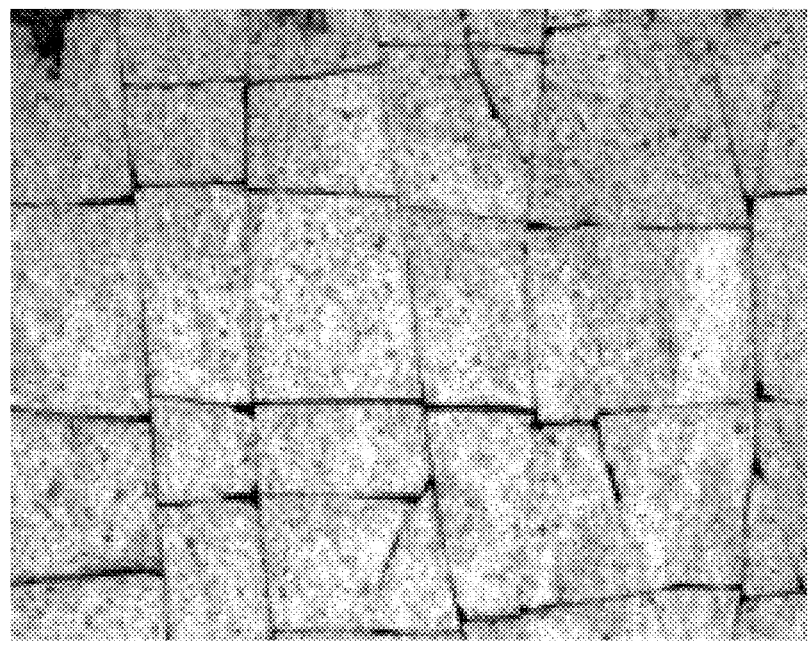
FIG. 7 is an image showing an example of cracks formed in a ceramic sheet which has been subjected to a flexion deformation process in X and Y directions.
Figure 8:
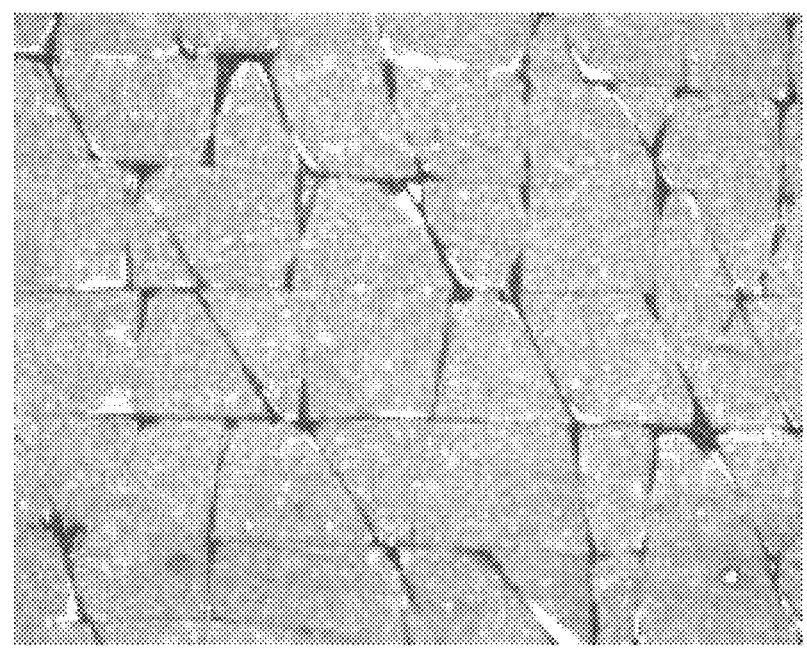
FIG. 8 is an image showing an example of cracks formed in a ceramic sheet which has been subjected to a flexion deformation process in X, Y, XY and X-Y directions.

Thereafter, step (b) may be repeated to form additional cracks in the ceramic laminate sheet having the plurality of cracks in the processing direction X. That is, in addition to the processing direction X, step (b) may be performed in a direction Y perpendicular to the direction X, a direction XY diagonal to the direction X, and another direction X-Y diagonal to the direction X, thereby forming additional cracks (see FIG. 6).

According to an embodiment, step (a) of forming the polymer resin layer is performed first, and then step (b) of forming the cracks is performed four times in total. Herein, cracks may be formed in four directions crossing one another, by primarily passing the laminate sheet under the pressure roller in the processing direction X, by secondarily passing the laminate sheet under the pressure roller in the direction Y perpendicular to the processing direction X, by tertiarily passing the laminate sheet under the pressure roller in the direction XY diagonal to the processing direction X, and by quaternarily passing the laminate sheet under the pressure roller in another direction X-Y diagonal to the processing direction X.

According to another embodiment, the roll lamination process is performed to form the laminate sheet simultaneously with forming a plurality of cracks by passing the laminate sheet under a pressure roller in the processing direction X, and thereafter step (b) of forming the cracks is performed three times. Herein, cracks may be formed in four directions crossing one another, by primarily passing the laminate sheet under the pressure roller in the direction Y perpendicular to the processing direction X, by secondarily passing the laminate sheet under the pressure roller in the direction XY diagonal to the processing direction X, and by tertiarily passing the laminate sheet under the pressure roller in another direction X-Y diagonal to the processing direction X.

The primary, secondary, tertiary and quaternary sub-steps in step (b) may be performed in this order, or in different orders. Alternatively, the primary, secondary, tertiary and quaternary sub-steps in step (b) may be performed at the same time, thereby enabling the process time for flexion deformation to be reduced.

Compared to the conventional method of forming lattices in a green sheet and then sintering the green sheet, the foregoing method for preparing the ceramic laminate sheet having flexibility can reduce process time and costs due to a simple process, and is applicable to all types of ceramic thin films, ceramic thick films, ceramic sheets, and ceramic laminate sheets which require flexibility.

Preparation Examples of Ceramic Laminate Sheet and Physical Property Test

Hereinafter, the present invention will be described in detail with reference to specific examples. The following examples are provided only to illustrate the present invention, and the details of the present invention are not limited by these examples.

Physical properties of the ceramic sheet tested below were evaluated through the following method.

(1) Measurements of Permeability and Permeability Loss

A ceramic laminate sheet was processed to have the shape of a magnet ring having an outer diameter of 18 mm, an inner diameter of 8 mm, and a ferrite thickness of 0.1 mm, and thereafter permeability and permeability loss were measured at an NFC operating frequency of 13.56 MHz using an impedance analyzer (Agilent, E4991A+16454A).

(2) 180° Bending Test

The ceramic laminate sheet was fixed between both holders using a peel tester (CK Trading Co., CKPT-180SS), and then the 180° bending test was performed to measure a force applied when the sheet was bent by moving one-side holder toward the other-side holder.

(3) Measurement of Density of Ceramic Pieces

The density of the ceramic pieces per unit area was measured from images captured by an optical microscope (Olympus, MX61L) at 9 points in a region of 30 mm×30 mm of the ceramic sheet with the flexible film removed. Then, the average of the measurement values at the 9 points was documented as the density of the ceramic pieces. Specifically, after regions of 2 mm×2 mm were drawn in each of the 9 points, the number of the ceramic pieces in each region was counted. When a piece existed across inner/outer portions of the region, the piece was counted as one only if 50% or more of the area of the piece was positioned within the region.

EXAMPLE 1

Preparation of Ceramic Laminate Sheet (without Groove, and Cracks in Two Directions)

Step 1) Preparation of Ferrite Green Sheet

Ni—Cu—Zn ferrite as ceramic powders and a composite binder, in which a binder, a plasticizer and a solvent were appropriately mixed, were mixed at a ratio of 60:40 by weight, and the resultant mixture was dispersed for 15 hours using a ball mill to thereby prepare slurry. A ferrite green sheet having a thickness of 0.1 mm was prepared through a tape casting method by using the slurry obtained.

Step 2) Preparation of Ferrite Sintered Body

To sinter the green sheet obtained, the temperature of the green sheet was increased up to 450° C. at a rate of from 0.5° C./min and kept at this temperature for 5 hours to burn. Afterwards, the temperature was increased again up to 950° C. at a rate of 3° C./min to perform a sintering reaction of ferrite powders. The sintered ferrite sheet had a thickness of 0.08 mm.

Step 3) Roll Lamination Process

A PET film (thickness: 0.010 mm) having a bonding layer, and a double-sided tape (adhesive component: acryl-based PSA, release paper component: PET, thickness excluding the release paper: 10 μm) were respectively attached to one side and the other side of the sintered ferrite sheet, and the resultant sheet was positioned at a double-sided roll laminator. Subsequently, the laminated ferrite sheet was passed between a rubber plate (thickness: 2 mm) of the double-sided roll laminator and the pressure roller, wherein the roll lamination process was performed at a rate of 0.5 m/min under the conditions in which the space between the rubber plate and the roller was adjusted to −0.5 mm and a pressure of 0.6 MPa was applied.

Step 4) Flexion Deformation Process Using a Roller

Thereafter, pressure rolling was performed on the laminate sheet in the same manner as in step 3) in the direction Y perpendicular to the processing direction X in step 3).

Comparative Example 1

Preparation of Ceramic Laminate Sheet (with Groove Formed, and Cracks in Two Directions)

Grooves having a depth of 0.030 mm and a space therebetween of 2 mm were formed in a lattice shape (that is, a lattice shape in an X direction and a Y direction perpendicular thereto) in the ferrite green sheet prepared in step 1)

of Example 1 by using a blade cutting apparatus, and then steps 2) to 4) of Example 1 were performed to prepare a ceramic laminate sheet.

Since the same ferrite green sheet as in Example 1 was used, the sintered ferrite sheet had a thickness of 0.08 mm equal to that in Example 1, and cracks were generated along the grooves formed in the sintered ferrite sheet during steps 3) and 4).

Experimental Example 1

Evaluation of Characteristics of Ceramic Laminate Sheet According to Presence or Absence of Grooves Measurement results of permeability and permeability loss of the ceramic laminate sheets prepared in Example 1 and Comparative Example 1 are shown in Table 1 below.

TABLE 1

| Ceramic laminate sheet | Groove formation | Density of ceramic pieces (number/cm$^2$) | Permeability/ Permeability loss |
|---|---|---|---|
| Example 1 | Groove not formed | 54.8 | 140.2/2.1 |
| Comparative Example 1 | Groove formed | 55.2 | 139.4/2.1 |

As shown in Table 1, although cracks were formed after sintering without the formation of lattice grooves in a green sheet, the ceramic laminate sheet of Example 1 exhibited a permeability equal or superior to the ceramic laminate sheet of Comparative Example 1 with lattice grooves formed. That is, it can be understood that the ceramic sheet without the groove has more excellent characteristics (physical properties) in the case where the ceramic sheet was divided into substantially the same number of pieces.

Therefore, the ceramic laminate sheet of the present invention makes it possible to reduce the process time and process costs in comparison to the conventional magnet sheet where grooves are formed in the green sheet and then sintered to have flexibility. That is, there are advantages in that a blade cutting apparatus for the formation of the grooves is not required, and also the time required for blade cutting can be significantly reduced.

EXAMPLES 2 to 9

Preparation of Ceramic Laminate Sheet (without Groove, and Cracks in Four Directions)

The ceramic laminate sheet was prepared in the same manner as in Example 1, but the flexion deformation of step 4) was further performed in the diagonal direction XY and another diagonal direction X-Y perpendicular thereto. The space between cracks and the density of ferrite pieces provided accordingly were adjusted by changing the diameter of the pressure roller, the space between the rubber plate and the roller, or the pressure, which were used in step 3) of roll lamination and step 4) of flexion deformation.

Experimental Example 2

Evaluation of Properties by Density of Ceramic Pieces

Examples 2 to 9 illustrate measurement values of permeability/permeability loss after performing a crack formation process (flexion deformation process) in the X direction, Y direction, diagonal direction (XY direction) and X-Y direction perpendicular to the XY direction, and values of permeability/permeability loss after a 180° bending test.

TABLE 2

| Ceramic laminate sheet | Piece density (number/cm$^2$) | Permeability/ Permeability loss | | Reduction ratio of permeability (%) |
|---|---|---|---|---|
| | | Initial | After 4-axes 180° bending test | |
| Example 2 | 50.3 | 140.2/2.1 | 132.4/2.0 | 5.56 |
| Example 3 | 242.7 | 134.1/2.0 | 131.7/1.9 | 1.79 |
| Example 4 | 405.4 | 132.5/1.8 | 130.9/1.8 | 1.21 |
| Example 5 | 623.5 | 131.2/1.8 | 129.7/1.8 | 1.14 |
| Example 6 | 895.3 | 130.4/1.8 | 130.3/1.8 | 0.08 |
| Example 7 | 1102.6 | 128.1/1.8 | 128.0/1.8 | 0.08 |
| Example 8 | 1341.2 | 124.3/1.7 | 124.3/1.7 | 0 |
| Example 9 | 1537.9 | 121.4/1.7 | 121.4/1.7 | 0 |

As can be seen from Table 2, the results of the 4-axes 180° bending test prove that the permeability loss is not great when the density of the ferrite pieces is 100 pieces/cm$^2$ or more, and particularly, that the permeability loss rarely occurs when the density of the ferrite pieces is 350 pieces/cm$^2$ or more, and also prove that the permeability loss is smaller as the density of the ferrite pieces becomes higher.

It can be understood that an initial permeability becomes lower as the density of the ferrite pieces becomes higher, and particularly, it can be understood that the permeability suitable for commercial production is achieved when the density of the ferrite pieces is 1,200 pieces/cm$^2$ or less. Also, when the density of the ferrite pieces is 1,200 pieces/cm$^2$ or more, a decrease in permeability does not appear after the 4-axes bending test, however, this result is not significantly different from that in the case where the density of the ferrite pieces is 1,200 pieces/cm$^2$ or less.

EXAMPLE 10

Preparation of Ceramic Laminate Sheet (without Groove, and Cracks in Four Directions)

The ceramic laminate sheet was prepared in the same manner as in Example 1, wherein the flexion deformation of step 4) was further performed in the diagonal direction XY and another diagonal direction X-Y perpendicular thereto, and the diameter of the pressure roller, the space between the rubber plate and the roller, or the pressure was adjusted to finally obtain the ceramic laminate sheet having the density of the ferrite pieces of 403 pieces/cm$^2$.

EXAMPLE 11

Preparation of Ceramic Laminate Sheet (without Groove, and Cracks in Two Directions)

The ceramic laminate sheet was prepared in the same manner as in Example 1 (that is, the flexion deformation process was performed only in the X direction and the Y direction), and the diameter of the pressure roller, the space between the rubber plate and the roller, or the pressure was adjusted to finally obtain the ceramic laminate sheet having the density of the ferrite pieces of 419 pieces/cm$^2$.

Experimental Example 3

Evaluation of Magnetic Properties after Bending Test in Each Direction

The initial permeability and permeability loss of each ceramic laminate sheet in Examples 10 and 11 were measured, and then the permeability and permeability loss of each ceramic laminate sheet were measured by bending the ceramic laminate sheet by 180° in the X axis, Y axis, XY axis and X-Y axis, respectively. The results are shown in Table 3.

TABLE 3

| Ceramic laminate sheet | Permeability/Permeability loss | | | | |
|---|---|---|---|---|---|
| | | After 180° bending test | | | |
| | Initial | X axis | Y axis | XY axis | X-Y axis |
| Example 10 | 132.5/1.8 | 132.2/1.8 | 131.8/1.8 | 131.4/1.8 | 130.9/1.8 |
| Example 11 | 133.8/2.0 | 133.4/2.0 | 133.0/2.0 | 130.1/1.8 | 128.8/1.8 |

As shown in Table 3, it can be verified that the magnetic properties of the ceramic laminate sheet of Example 10 are not greatly decreased even when the ceramic laminate sheet is bent in any direction.

On the contrary, it is observed that the permeability of the ceramic laminate sheet of Example 11 is significantly reduced when the sheet is bent in the XY axial direction or X-Y axial direction. This is because the ceramic sheet of Example 11, although having flexibility in the X axis and Y axis directions, does not have flexibility in the XY axis or X-Y axis, and thus a number of cracks are further generated when the sheet is bent in these diagonal directions, leading to a further decrease in permeability.

Therefore, it can be verified that, even though the sheets have the same density of crack pieces, the sheet, which is subjected to the additional crack formation process in the XY axis and X-Y axis as well as the X axis and Y axis, can be far from degradation of the physical properties during a ferrite attachment process, and can also exhibit improved flexibility.

Experimental Example 4

Evaluation of Forces Required for Bending in Each Direction

Forces applied to bend the ceramic laminate sheets of Examples 10 and 11 were measured using a peel tester. For this test, 180° bending was applied to each sheet in the X axis direction and then the force applied was measured. Thereafter, 180° bending was applied to the sheets in the Y axis, XY axis and X-Y axis, respectively, and then forces applied in each step were measured. The results are shown in Table 4.

TABLE 4

| Ceramic laminate sheet | Force applied for 180° bending (gf) | | | |
|---|---|---|---|---|
| | X axis | Y axis | XY axis | X-Y axis |
| Example 10 | 2.5 | 2.7 | 2.6 | 2.7 |
| Example 11 | 2.6 | 2.7 | 9.5 | 9.1 |

As shown in Table 4, it can be seen that the forces required for the ceramic laminate sheet of Example 10 are maintained constant without significant deviation therebetween even when the ceramic laminate sheet is bent in any direction. On the contrary, the forces required for the ceramic laminate sheet of Example 11 are considerably increased when the sheet is bent in the XY axis or X-Y axis.

This is because the ceramic sheet of Example 11, although having flexibility in the X axis and Y axis directions, does not have flexibility in the XY axis or X-Y axis, and thus a stress is applied to the inside of the ceramic when the sheet is bent in the diagonal direction, thereby requiring force for additionally generating cracks in the ceramic.

Consequently, it can be understood that the ferrite sheet with excellent flexibility can be prepared by performing the additional crack formation process in the XY axis and X-Y axis as well as the X axis and Y axis.

EXAMPLE 12

Preparation of Ceramic Laminate Sheet (without Groove, and Cracks in Four Directions)

The ceramic laminate sheet was prepared in the same manner as in Example 1, wherein the bending deformation of step 4) was further performed in the diagonal direction XY and another diagonal direction X-Y perpendicular thereto, and the diameter of the pressure roller, the space between the rubber plate and the roller, or the pressure was adjusted to finally obtain the ceramic laminate sheet having the density of the ferrite pieces of 890.7 pieces/cm$^2$.

EXAMPLE 13

Preparation of Ceramic Laminate Sheet (without Groove, and Cracks in Two Directions)

The ceramic laminate sheet was prepared in the same manner as in Example 1.

Experimental Example 5

Evaluation of Flexion Deformation According to the Number of Crack Forming Directions Pressure rolling was further performed on the ceramic sheets prepared in Examples 12 and 13 in four directions (X, Y, XY and X-Y), wherein the rollers for the respective sheets have diameters of 10 mm, 20 mm, 30 mm, and 40 mm, respectively, and the pressure rolling was performed on each sheet four times in total. Permeability and permeability loss of each sheet subjected to the pressure rolling were measured.

TABLE 5

| Ceramic laminate sheet | Piece density (number/cm²) | Initial value | Permeability/Permeability loss | | | |
|---|---|---|---|---|---|---|
| | | | After pressure rolling | | | |
| | | | Pressure roller with diameter of 40 mm | Pressure roller with diameter of 30 mm | Pressure roller with diameter of 20 mm | Pressure roller with diameter of 10 mm |
| Example 12 | 890.7 | 131.4/1.8 | 131.4/1.8 | 131.2/1.8 | 130.9/1.8 | 130.3/1.8 |
| Example 13 | 55.6 | 129.2/1.8 | 128.1/1.8 | 126.1/1.8 | 124.1/1.8 | 122.1/1.8 |

As shown in Table 5, the magnetic properties of the ceramic laminate sheet in Example 12 of the present invention were rarely changed although the pressure rolling was further performed.

On the contrary, degradation in the magnetic property (permeability) of the ceramic laminate sheet of Example 13 occurred as the pressure rolling was further performed. As the diameter of the pressure roller was smaller, the magnetic property of the ceramic laminate sheet became poorer. This is because cracks were additionally formed in the ceramic sheet of Example 13 as the pressure rolling was further performed, and particularly more cracks were formed as the diameter of the pressure roller was larger.

Therefore, it can be understood that the ferrite laminate sheet subjected to the additional crack forming process in the XY direction and X-Y direction as well as the X and Y directions has insignificant decrease in magnetic properties although the flexion deformation force is applied.

EXAMPLES 14 to 22

Preparation of Ceramic Laminate Sheet (without Groove, and Cracks in Four Directions)

The ceramic laminate sheet was prepared in the same manner as in Example 1, wherein the flexion deformation of step 4) was further performed in the diagonal direction XY and another diagonal direction X-Y perpendicular thereto, and diameters of the pressure rollers used in step 3) and step 4) were changed, thereby forming ceramic laminate sheets having different spaces between cracks.

Experimental Example 6

Evaluation of Permeability According to Change in Space Between Cracks

In preparation of the ceramic laminate sheets of Examples 14 to 22, a permeability (A) was measured first in a state where the flexion deformation was performed only in two directions (i.e., X and Y), then 180° bending was applied in four directions (i.e., X, Y, XY, X-Y) using a peel tester to measure a permeability (B), and a permeability decrease (A-B) was calculated.

Also, in Examples 14 to 22, a permeability (C) was measured first in a state where the flexion deformation was performed in four directions (i.e., X, Y, XY, X-Y), then 180° bending was applied in the four directions (i.e., X, Y, XY, X-Y) using a peel tester to measure a permeability (D), and a permeability decrease (C-D) was calculated.

The results are shown in Table 6. A space (L) between parallel cracks in Table 6 below corresponds to an average value which was obtained in such a way that nine different points were selected in one ferrite sheet, the largest space and the smallest space were then measured from each point, and the measurement values were averaged. That is, 20 measurement values were obtained for each sheet, and then averaged. Here, the space between the parallel cracks does not mean a space between mathematically parallel cracks, but includes a space between substantially parallel cracks. Thus, the space between the parallel cracks indicates the space between cracks which do not encounter and of which a difference in angle therebetween is 5° or less.

TABLE 6

| Ceramic laminate sheet | Average space between parallel cracks (μm) (L) | Initial permeability | Permeability | | Reduction in permeability (%) ((A − B)/ A × 100) | Permeability | | Reduction in permeability (%) ((C − D)/ C × 100) |
|---|---|---|---|---|---|---|---|---|
| | | | After pressure rolling in two directions (A) | After 180° bending test in four directions (B) | | After pressure rolling in four directions (C) | After 180° bending test in four directions (D) | |
| Example 14 | 2101.1 | 143 | 136 | 133 | 2.21 | 133 | 132 | 0.75 |
| Example 15 | 1270.3 | 140 | 135 | 132 | 2.22 | 132 | 131 | 0.76 |
| Example 16 | 710.4 | 135 | 134 | 132 | 1.49 | 132 | 132 | 0 |
| Example 17 | 503.5 | 133 | 133 | 131 | 1.50 | 131 | 131 | 0 |
| Example 18 | 407.3 | 131 | 131 | 130 | 0.76 | 130 | 130 | 0 |

TABLE 6-continued

| Ceramic laminate sheet | Average space between parallel cracks (μm) (L) | Initial permeability | Permeability After pressure rolling in two directions (A) | Permeability After 180° bending test in four directions (B) | Reduction in permeability (%) ((A − B)/ A × 100) | Permeability After pressure rolling in four directions (C) | Permeability After 180° bending test in four directions (D) | Reduction in permeability (%) ((C − D)/ C × 100) |
|---|---|---|---|---|---|---|---|---|
| Example 19 | 325.7 | 129 | 129 | 129 | 0 | 129 | 129 | 0 |
| Example 20 | 294.3 | 127 | 127 | 127 | 0 | 127 | 127 | 0 |
| Example 21 | 273.4 | 124 | 124 | 124 | 0 | 124 | 124 | 0 |
| Example 22 | 254.3 | 121 | 121 | 121 | 0 | 121 | 121 | 0 |

As shown in Table 6, if the average space (L) between parallel cracks was 800 μm or less, the reduction ratio of permeability caused by 180° bending was low so that the ceramic sheet was favorably used as a magnet sheet. In particular, when the average space (L) between the parallel cracks was 800 μm or less and pressure rolling was performed in four directions, there was no reduction in permeability caused by 180° bending.

Also, if the average space (L) between parallel cracks was 600 μm or less, the reduction ratio of permeability caused by 180° bending was extremely low so that the ceramic sheet was more favorably used as a magnet sheet. In particular, when the average space (L) between the parallel cracks was 325.7 μm or less, there was no reduction in permeability caused by 180° bending.

It can be understood that flexibility and reliability of magnetic property can be ensured as long as the average space (L) between parallel cracks is 300 μm or more.

While the invention has been described with respect to the above specific embodiments, it should be recognized that various modifications and changes may be made to the invention by those skilled in the art which also fall within the scope of the invention as defined by the appended claims.

What is claimed is:

1. A method for preparing a ceramic laminate sheet comprising the steps of:
    (a) forming a polymer resin layer on one side or both sides of a sintered ceramic sheet to obtain a laminate sheet; and
    (b) forming a plurality of cracks in the ceramic sheet by pressurizing the laminate sheet to divide the ceramic sheet into a plurality of pieces, wherein the plurality of cracks are disposed in at least two directions crossing each other,
    wherein
    (i) the step (a) of forming the polymer resin layer and the step (b) of forming the cracks are performed simultaneously through a roll lamination process;
    (ii) the number of the plurality of pieces formed is in the range of 350 to 950 per unit area of cm² of the ceramic sheet;
    (iii) the pressurizing in step (b) is performed at least two times by allowing the laminate sheet to pass between a pressure roller and an elastic roller, firstly in a processing direction X and secondly in a direction Y perpendicular to the processing direction X;
    (iv) grooves for formation of the cracks are not provided in both sides of the ceramic sheet; and
    (v) an average space between parallel cracks of the plurality of cracks is in the range of 300 μm to 600 μm.

2. The method of claim 1, wherein the step (b) of forming the cracks is performed three times to form additional cracks in the ceramic laminate sheet by additionally passing the laminate sheet under the pressure roller in the direction XY diagonal to the processing direction X, followed by passing the laminate sheet under the pressure roller in another direction X-Y diagonal to the processing direction X.

* * * * *